United States Patent
Interrante et al.

(10) Patent No.: US 6,518,674 B2
(45) Date of Patent: Feb. 11, 2003

(54) TEMPORARY ATTACH ARTICLE AND METHOD FOR TEMPORARY ATTACH OF DEVICES TO A SUBSTRATE

(75) Inventors: Mario J. Interrante, New Paltz, NY (US); Thomas E. Lombardi, Poughkeepsie, NY (US); Frank L. Pompeo, Montgomery, NY (US); William E. Sablinski, Beacon, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/805,596

(22) Filed: Mar. 13, 2001

(65) Prior Publication Data

US 2001/0008778 A1 Jul. 19, 2001

Related U.S. Application Data

(62) Division of application No. 09/404,511, filed on Sep. 23, 1999, now Pat. No. 6,303,400.

(51) Int. Cl.$^7$ .......................... H01L 23/48; H01L 23/52; H01L 29/40; H01L 21/44; H01L 21/48; H01L 21/50; B23K 31/00; B23K 31/02
(52) U.S. Cl. ..................... 257/772; 257/779; 438/108; 438/616; 228/180.22
(58) Field of Search .............................. 257/772, 779; 438/108, 616; 228/180.22

(56) References Cited

U.S. PATENT DOCUMENTS

| | | | | |
|---|---|---|---|---|
| 4,739,917 A | | 4/1988 | Baker | 228/123 |
| 5,089,880 A | * | 2/1992 | Meyer et al. | 357/75 |
| 5,237,269 A | | 8/1993 | Aimi et al. | 324/158 R |
| 5,270,571 A | * | 12/1993 | Parks et al. | 257/686 |
| 5,391,514 A | | 2/1995 | Gall et al. | |
| 5,468,655 A | * | 11/1995 | Greer | 437/8 |
| 5,488,200 A | | 1/1996 | Tsukada | 174/261 |
| 5,535,936 A | | 7/1996 | Chong et al. | 228/175 |
| 5,786,271 A | | 7/1998 | Ohida et al. | |

* cited by examiner

Primary Examiner—Tuan H. Nguyen
Assistant Examiner—Nema Berezny
(74) Attorney, Agent, or Firm—Ira D. Blecker

(57) ABSTRACT

A temporary attach article of a first component to a second component which includes a first component having a first volume of a fusible material; a second component having a second volume of fusible material; and the first and second components being joined together through the first and second volumes of fusible material, wherein the first volume of fusible material has a melting point higher than a melting point of the second volume of fusible material so that the first and second components may be joined together without melting of the first volume of fusible material and wherein the second volume of fusible material is 5 to 20% of the first volume of fusible material. Also disclosed is a method for temporary attach of devices to an electronic substrate.

7 Claims, 1 Drawing Sheet

TEMPORARY ATTACH ARTICLE AND METHOD FOR TEMPORARY ATTACH OF DEVICES TO A SUBSTRATE

RELATED APPLICATION

This application is a division of U.S. application Ser. No. 09/404,511, filed Sep. 23, 1999, now U.S. Pat. No. 6,303,400.

BACKGROUND OF THE INVENTION

The present invention relates to the attachment of semiconductor devices and the like to an electronic substrate and, more particularly, relates to the temporary attachment of semiconductor devices and the like to an electronic substrate for testing and burn-in.

The method of attaching semiconductor devices to an electronic substrate, for example a ceramic material, by controlled collapse chip connection (C4), also known as flip chip attach, is well known in the art. In the C4 method, an array of solder balls is formed on the surface of the semiconductor device. The solder balls are typically composed of high melting point solder, for example 97 weight % lead, 3 weight percent tin (97/3), at an approximate pitch of 10 mils. The solder is reflowed at a temperature of about 350° C. to join the semiconductor device to the electronic substrate. There can be one semiconductor device per electronic substrate, known as a single-chip module (SCM), or multiple semiconductor devices per electronic substrate, known as a multi-chip module (MCM).

After manufacture of the semiconductor devices, they are tested for electrical continuity. More recently, semiconductor devices undergo "burn-in" which is the preliminary operation of the semiconductor device to detect early failure of the functioning of the semiconductor device. There is a growing need in the microelectronics industry for known good die (KGD), which are semiconductor devices that have been tested and burned-in and are known to be good prior to sale or installation. It is also desirable that semiconductor devices used to populate an MCM be known to be good prior to being placed on the MCM, so that it is not necessary to reflow the MCM several times to replace semiconductor devices that may be bad.

In order to produce KGD, one method is to test the semiconductor device on a ceramic carrier to which the KGD has been soldered. The carrier, or electronic substrate, can be a standard single-chip carrier, which enables the semiconductor device to be tested and burned-in. A key attribute of this process should be the ability to remove the semiconductor device from the electronic substrate without damaging the semiconductor device or the C4 solder balls on the semiconductor device, so that the semiconductor device can be used in its final application. It is a simple matter to mount a semiconductor device on a conventional electronic substrate by the C4 connection method and test and burn-in the semiconductor device. However, the matter is complicated when removal of the semiconductor device is attempted without damaging the C4 solder bumps on the semiconductor device so that the semiconductor device may be used on another electronic substrate.

Today, this problem has been addressed by using a ceramic electronic substrate with reduced solderable pads on the top surface of the electronic substrate. Using a C4 pad on the electronic substrate which is approximately 1.5 mils in diameter, as opposed to the standard pad size of 5.5 mils, enables a semiconductor device to be joined to the electronic substrate by reflow of the C-4 solder balls, tested, burned-in and subsequently cold-sheared off of the electronic substrate. The effectiveness of this solution requires a reduced area solderable connection on the electronic substrate.

Aimi et al. U.S. Pat. No. 5,237,269, the disclosure of which is incorporated by reference herein, provides a reduced area solderable connection on the electronic substrate by masking the solderable area with an overlay which is made of a non-wettable material to which solder will not adhere. Holes are provided in the overlay such that a restricted connection may be made between the C-4 solder balls and the underlying solderable area of the electronic substrate. After testing, the C-4 solder balls are sheared from the electronic substrate and then reflowed to reshape them for subsequent use.

Various solutions have been proposed for joining semiconductor devices to electronic substrates. Chong et al. U.S. Pat. No. 5,535,936, the disclosure of which is incorporated by reference herein, discloses a method of applying low temperature solder in a fine pitch pattern on a printed circuit board for the purpose of attaching (permanently apparently) a semiconductor device to a printed circuit board. As noted at column 2, lines 18–22, approximately 20–80 cubic mils of solder are needed on the printed circuit board for a reliable joint.

Tsukada U.S. Pat. No. 5,488,200, the disclosure of which is incorporated by reference herein, discloses a method for reusing SCM or MCM substrates by end milling the chips and underfill off the top surface of the substrate and establishing a planar surface of residual C4 solder to which a new chip can be joined using low temperature solder.

Baker U.S. Pat. No. 4,739,917, the disclosure of which is incorporated by reference herein, discloses high temperature solder mounds deposited on conductive pads on the substrate which function only as mechanical guides for the various lead configurations of the components. Then, low temperature solder is deposited and reflowed over the mechanically anchored high temperature mounds and component leads to make the joint.

It would be desirable to be able to have a process for temporary attachment of the semiconductor device to an electronic substrate for use in test and burn-in, and subsequent removal of the semiconductor device without damaging the C4 solder balls on the semiconductor device, which is low cost and easily manufacturable.

Accordingly, it is a purpose of the present invention to have a process for temporary attachment of the semiconductor device to an electronic substrate for use in test and burn-in, and subsequent removal of the semiconductor device without damaging the C4 solder balls on the semiconductor device.

It is another purpose of the present invention to have such a process which is relatively low cost and easily manufacturable.

It is yet another purpose of the present invention to have an article for the temporary attachment of the semiconductor device to an electronic substrate for use in test and burn-in, and subsequent removal of the semiconductor device without damaging the C4 solder balls on the semiconductor device.

These and other purposes of the present invention will become more apparent after referring to the following description considered in conjunction with the accompanying drawings.

BRIEF SUMMARY OF THE INVENTION

According to a first aspect of the invention, there is a temporary attach article of a first component to a second component comprising:

a first component having a first volume of a fusible material;

a second component having a second volume of fusible material;

the first and second components being joined together through the first and second volumes of fusible material, wherein the first volume of fusible material has a melting point higher than a melting point of the second volume of fusible material so that the first and second components are joined together without melting of the first volume of fusible material and wherein the second volume of fusible material is 5 to 20% of the first volume of fusible material.

According to a second aspect of the invention, there is a method of temporarily attaching a first component to a second component, the method comprising the steps of:

preparing a first component having a first volume of fusible material;

preparing a second component having a second quantity of fusible material, wherein the first volume of fusible material has a melting point higher than a melting point of the second volume of fusible material and wherein the second volume of fusible material is 5 to 20% of the first volume of fusible material;

joining the first and second components through the first and second volumes of fusible material without melting of the first volume of fusible material.

According to a third aspect of the present invention, there is a method of temporarily attaching a first component to a second component, the method comprising the steps of:

preparing a first component having a first volume of fusible material;

preparing a second component having a second volume of fusible material, wherein the first volume of fusible material has a melting point higher than a melting point of the second volume of fusible material and wherein the second volume of fusible material is 5 to 20% of the first volume of fusible material;

joining the first and second components through the first and second volumes of fusible material without melting of the first volume of fusible material;

electrically testing and burning-in the first component; and separating the first and second components.

BRIEF DESCRIPTION OF THE DRAWINGS

The features of the invention believed to be novel and the elements characteristic of the invention are set forth with particularity in the appended claims. The Figures are for illustration purposes only and are not drawn to scale. The invention itself, however, both as to organization and method of operation, may best be understood by reference to the detailed description which follows taken in conjunction with the accompanying drawings in which:

DETAILED DESCRIPTION OF THE INVENTION

Figure 1:
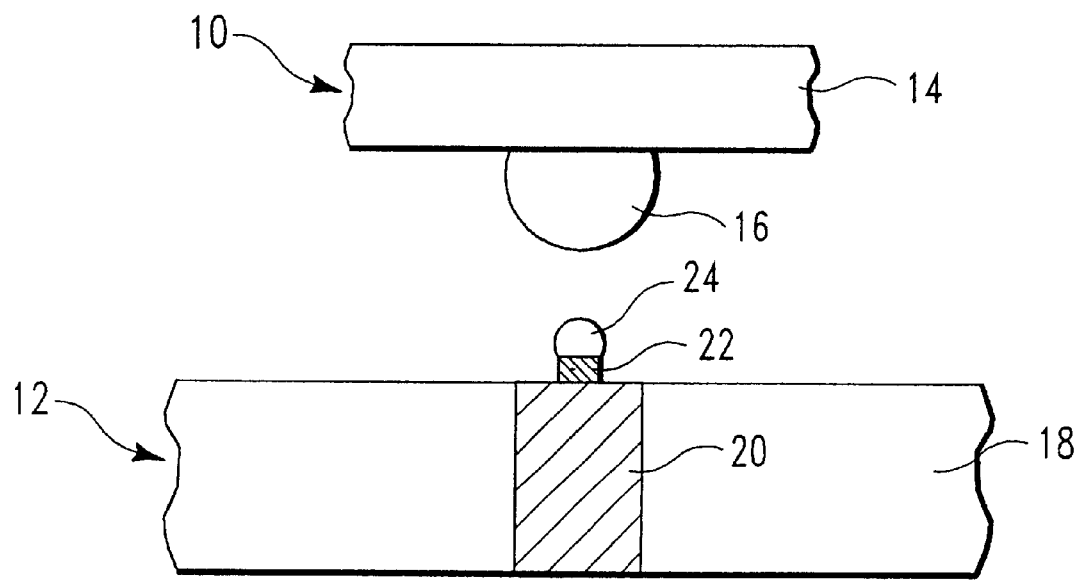
FIG. 1 is a schematical representation of a first embodiment of temporarily attaching a first component to a second component.

Referring to the drawings in more detail, and particularly referring to FIG. 1, there is shown a first embodiment of the present invention. It is desired to temporarily attach first component 10 to second component 12 for electrical testing and burn-in. First component 10 will usually be a semiconductor device such as an integrated circuit die but could also be a passive device such as a capacitor. Second component 12 will be an electronic substrate suitable for receiving the first component 10 and will usually be a ceramic or glass-ceramic substrate but could also be a printed circuit board.

First component 10 consists of body 14 having all the usual internal circuitry and ball 16 of fusible material. As is well known to those skilled in the art, there will usually be an array of fusible balls 16 but only one is shown here for clarity. Fusible ball 16 has been formed on body 14 by conventional techniques. Fusible ball 16 typically comprises a lead/tin solder. One typical composition is 97 weight % lead and 3 weight % tin which has a melting point in excess of 300° C.

Second component 12 consists of body 18 having internal circuitry, part of which is shown as via 20. On top of via 20 is reduced area pad 22 on which has been deposited a quantity of fusible material 24. As an example, via 20 may be 5 to 6 mils in diameter and may be made from molybdenum or copper while reduced area pad 22 is smaller in dimensions, e.g., 2 to 3 mils in diameter, and may be selectively plated nickel or nickel/gold. Fusible material 24 may be tin, indium, an alloy of lead and tin or an alloy of tin and bismuth but should have a melting temperature less than fusible material 16 and preferably less than about 200° C. During the joining of the first component 10 to the second component 12, fusible material 16 must not melt so fusible material 24 should have a melting point much lower than that of fusible material 16 so that joining of the two components 10, 12 can be accomplished at a temperature less than the melting temperature of fusible material 16. Thus, the alloy of lead and tin should preferably be a eutectic alloy (melting point about 183° C.) while the alloy of tin and bismuth should also be a eutectic alloy (melting point about 139° C.). Indium has a melting point of 156° C. While tin has a melting point of 232° C., it is acceptable for use in the present invention if a reflow temperature of about 250° C. can be tolerated.

Fusible material 24 is smaller in volume than fusible material 16. The volume of fusible material 24 should be just large enough to accomplish electrical testing and burn-in while also mechanically anchoring the first component 10 to the second component 12. It is also advantageous to keep the volume of fusible material 24 as small as possible so as to facilitate removal of first component 10 from second component 12 without damaging fusible material 16. The present inventors have found that the volume of fusible material 24 should be about 5 to 20% of the volume of fusible material 16. Qualitatively, it can be appreciated that the volume of fusible material 24 is substantially less than the volume of fusible material 16.

For example, for a typical first component 10 having joining pads (not shown) of 5 mils in diameter and a 10 mil pitch (center to center of adjoining pads), the volume of the fusible material 16 is about 76 cubic mils. The dimensions of the quantity of fusible material 24 deposited would be about 2 to 3 mils in diameter and 1 to 2 mils in height, resulting in a volume of fusible material 24 of 3.14 to 14.2 cubic mils. Then, comparing the respective volumes of the fusible materials 16, 24, it can be seen that the volume of fusible material 24 is 4 to 18.6% of the volume of fusible material 16.

Fusible material 24 may be deposited by any conventional process including, but not limited to, screening of fusible material paste, micro-dispense of molten fusible material drops, decal transfer process or a photolithographic process.

The first component 10 and second component 12 can be separated by any conventional process including, but not limited to, cold shear of the first component 10 off of the second component 12, hot shear (for example, in a belt furnace at a temperature less than the solidus of fusible material 16 but greater than the liquidus of fusible material 24), hot tensile pull or hot vacuum removal.

Further, the bias temperature between the first and second components 10, 12 can be modified for the hot removal options to optimize the removal of the first component 10 from the second component 12. For example, the second component 12 can be separately heated or nitrogen can be directed at the first component 10 while in the furnace to cool the first component 10, thereby increasing the temperature difference between the first component 10 and second component 12. In this manner, the lower melting fusible material 24 will remain mostly on the second component 12 and the fusible material ball 16 will be relatively unaffected.

As another alternative, fusible material 24 may be kept in a molten state after joining and during electrical testing and burn-in. While the fusible material 24 is still molten, the first and second components 10, 12 may be easily separated with minimal contamination of, or damage to, fusible material 16.

By controlling the amount of fusible material 24 and the removal conditions as just described, the integrity of the fusible material ball 16 can be assured to be satisfactory for when the first component 10 is permanently joined to its carrier. This is especially the case in the present invention since fusible material ball 16 never has to be reflowed.

After removal of the first component 10 from the second component 12, the second component 12 can be reused many times. If the volume of fusible material 24 remaining on the second component 12 is sufficient, the second component 12 may be reused as is. If the volume of fusible material 24 is insufficient, additional fusible material 24 may be added. After some number of uses, second component 12 will have to be reworked which can be accomplished by removing any residual fusible material 24 (such as by a vacuum pencil or a porous copper block) and then redepositing the required amount of fusible material 24.

Figure 2:
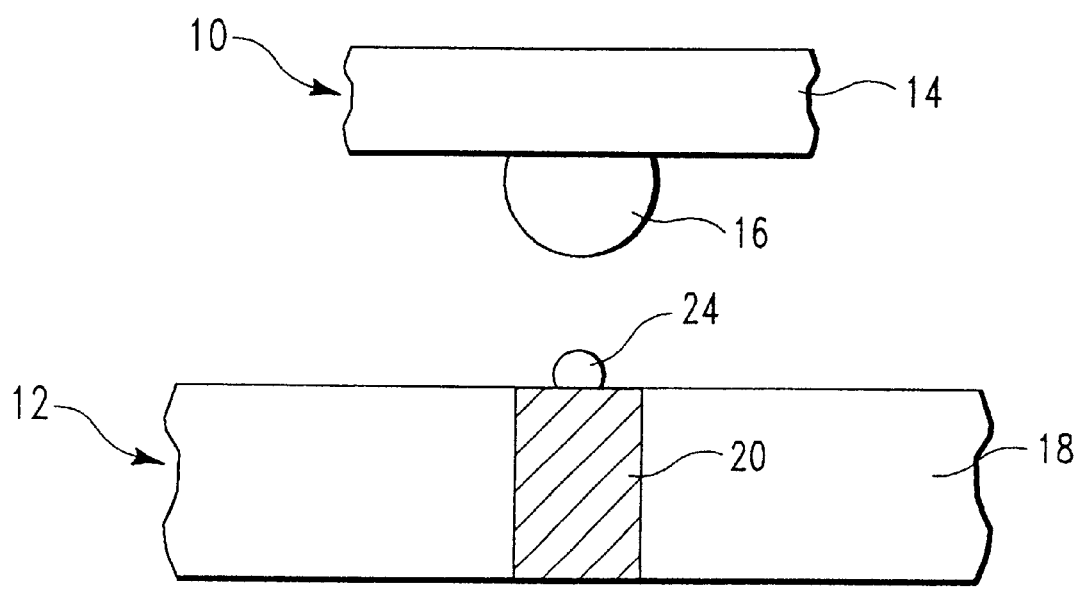
FIG. 2 is a schematical representation of a second embodiment of temporarily attaching a first component to a second component.

Referring now to FIG. 2, the second embodiment of the present invention will now be discussed. First component 10 and second component 12 of FIG. 2 are identical to first component 10 and second component 12 as discussed previously with respect to FIG. 1 except that reduced area pad 22 is no longer present in second component 12. Typical via size, such as via 20 in FIG. 1, is about 5 to 6 mils in diameter.

However, the present inventors have found that if the via size is reduced to 2 to 3 mils, as is the case with via 20 in FIG. 2, reduced area pad 22 may be dispensed with. In this case, fusible material 24 is deposited directly on via 20 as shown in FIG. 2.

It will be apparent to those skilled in the art having regard to this disclosure that other modifications of this invention beyond those embodiments specifically described here may be made without departing from the spirit of the invention. Accordingly, such modifications are considered within the scope of the invention as limited solely by the appended claims.

What is claimed is:

1. A temporary attach article of a first component to a second component comprising:
    a first component having a first volume of a fusible material;
    a second component having a second volume of fusible material;
    the first and second components being joined together through the first and second volumes of fusible material, wherein the first volume of fusible material has a melting point higher than a melting point of the second volume of fusible material so that the first and second components may be joined together without melting of the first volume of fusible material and wherein the second volume of fusible material is 5 to 20% of the first volume of fusible material.

2. The temporary attach article of claim 1 wherein the first component is a semiconductor device and the second component is an electronic component.

3. The temporary attach article of claim 1 wherein the first volume of fusible material is a lead/tin alloy.

4. The temporary attach article of claim 1 wherein the second volume of fusible material is selected from the group consisting of tin, indium, alloys of lead and tin and alloys of tin and bismuth.

5. The temporary attach article of claim 1 wherein the second component has a via and the second volume of fusible material is bonded directly to the via.

6. The temporary attach article of claim 1 wherein the second component has a via and a pad on the via where the pad is smaller in cross-sectional area than the via and the second volume of fusible material is bonded directly to the pad.

7. The temporary attach article of claim 1 wherein after the first and second components are joined, the second volume of fusible material is maintained in a molten state.

* * * * *